US008716693B2

(12) United States Patent
Son

(10) Patent No.: US 8,716,693 B2
(45) Date of Patent: *May 6, 2014

(54) LIGHT EMITTING DEVICE AND LIGHT EMITTING DEVICE PACKAGE FOR IMPROVING A LIGHT EMISSION EFFICIENCY

(71) Applicant: LG Innotek Co., Ltd, Seoul (KR)

(72) Inventor: Hyo Kun Son, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/679,724

(22) Filed: Nov. 16, 2012

(65) Prior Publication Data

US 2013/0075695 A1 Mar. 28, 2013

Related U.S. Application Data

(63) Continuation of application No. 12/911,965, filed on Oct. 26, 2010, now Pat. No. 8,314,414.

(30) Foreign Application Priority Data

Oct. 26, 2009 (KR) .................... 10-2009-0101959

(51) Int. Cl.
*H01L 29/06* (2006.01)
*H01L 31/00* (2006.01)

(52) U.S. Cl.
USPC ............... 257/13; 257/14; 257/80; 257/86; 438/22; 438/46

(58) Field of Classification Search
USPC ........... 257/13, 14, 79, 80, 81, 82, 84, 85, 86, 257/89, 94, 21, 432, 433, 434, 431; 438/22, 438/24, 46, 47, 48, 54, 69, 64

See application file for complete search history.

(56) References Cited

U.S. PATENT DOCUMENTS

| 5,665,984 A | 9/1997 | Hasegawa et al. |
| 8,314,414 B2 * | 11/2012 | Son .................................. 257/13 |
| 2003/0001170 A1 | 1/2003 | Shibata et al. |
| 2003/0022028 A1 | 1/2003 | Koike et al. |
| 2003/0080331 A1 | 5/2003 | Ono et al. |
| 2005/0151154 A1 | 7/2005 | Akita et al. |
| 2005/0179027 A1 | 8/2005 | Kim et al. |
| 2005/0218416 A1 | 10/2005 | Cho et al. |

(Continued)

FOREIGN PATENT DOCUMENTS

| EP | 1 220 333 A2 | 7/2002 |
| EP | 2006887 | 12/2008 |

(Continued)

*Primary Examiner* — Thanh Y Tran
(74) *Attorney, Agent, or Firm* — McKenna Long & Aldridge LLP

(57) ABSTRACT

A light emitting device, a method of manufacturing the same, a light emitting device package, and a lighting system are disclosed. The light emitting device may include a first conductive semiconductor layer, a second conductive semiconductor layer, and an active layer interposed between the first and second conductive semiconductor layers. The first conductive semiconductor layer, the active layer, and the second conductive semiconductor layer may include Al. The second conductive semiconductor layer may have Al content higher than Al content of the first conductive semiconductor layer. The first conductive semiconductor layer may have Al content higher than Al content of the active layer.

45 Claims, 4 Drawing Sheets

(56) References Cited

U.S. PATENT DOCUMENTS

| | | |
|---|---|---|
| 2007/0101932 A1 | 5/2007 | Schowalter et al. |
| 2007/0170459 A1 | 7/2007 | Kyono et al. |
| 2008/0054248 A1 | 3/2008 | Chua et al. |
| 2008/0237620 A1* | 10/2008 | Shiue et al. .............. 257/98 |
| 2008/0296627 A1 | 12/2008 | Watanabe et al. |
| 2009/0166608 A1 | 7/2009 | Nakanishi et al. |
| 2010/0314605 A1 | 12/2010 | Khan |

FOREIGN PATENT DOCUMENTS

| | | |
|---|---|---|
| JP | 09064414 | 3/1997 |
| JP | 2002368268 | 12/2002 |
| JP | 2005-259827 | 9/2005 |
| KR | 10-2005-0074918 | 7/2005 |
| KR | 10-2007-0078382 | 7/2007 |
| KR | 10-0764433 | 10/2007 |
| KR | 10-2008-0089043 | 10/2008 |

* cited by examiner

LIGHT EMITTING DEVICE AND LIGHT EMITTING DEVICE PACKAGE FOR IMPROVING A LIGHT EMISSION EFFICIENCY

This application is a continuation application of U.S. Pat. No. 8,314,414, issue date Nov. 20, 2012, which claims priority under 35 U.S.C. §119(a) of Korean Patent Application No. 10-2009-0101959 filed on Oct. 26, 2009, which are hereby incorporated by reference in their entirety as if fully set forth herein.

BACKGROUND

The embodiment relates to a light emitting device, a method of manufacturing the same, a light emitting device package, and a lighting system.

A light emitting diode (LED) is a semiconductor light emitting device that converts current into light. Recently, the brightness of the LED has increased, so that the LED has been employed as a light source for display devices, vehicles, or lighting devices. In addition, the LED can represent a white color having superior light efficiency by employing phosphors or combining LEDs having various colors.

The brightness of the LED is dependant on various conditions such as the structure of an active layer, a light extraction structure sufficient to effectively extract light to the outside, a semiconductor material used in the LED, a chip size, and the type of molding member surrounding the LED.

SUMMARY

An exemplary embodiment provides a light emitting device capable of reducing leakage current, a method of manufacturing the same, a light emitting device package, and a lighting system, An exemplary embodiment provides a light emitting device having a superior current spreading effect, a method of manufacturing the same, a light emitting device package, and a lighting system.

An exemplary embodiment provides a light emitting device having superior crystalline, a method of manufacturing the same, a light emitting device package, and a lighting system.

An exemplary embodiment provides a light emitting device having improved internal quantum efficiency, a method of manufacturing the same, a light emitting device package, and a lighting system.

An exemplary embodiment provides a light emitting device having a reduced piezoelectric effect, a method of manufacturing the same, a light emitting device package, and a lighting system.

According to an exemplary embodiment, a light emitting device may include a first conductive semiconductor layer, a second conductive semiconductor layer, and an active layer interposed between the first and second conductive semiconductor layers. The first conductive semiconductor layer, the active layer, and the second conductive semiconductor layer may include Al. The second conductive semiconductor layer may have Al content higher than Al content of the first conductive semiconductor layer. The first conductive semiconductor layer may have Al content higher than Al content of the active layer.

According to an exemplary embodiment, a light emitting device package may include a package body, first and second electrode layers mounted on the package body, a light emitting device provided on the package body and electrically connected to the first and second electrode layers. The light emitting device may include a first conductive semiconductor layer, a second conductive semiconductor layer and an active layer interposed between the first and second conductive semiconductor layers. The first conductive semiconductor layer, the active layer, and the second conductive semiconductor layer may include Al, the second conductive semiconductor layer may have Al content higher than Al content of the first conductive semiconductor layer, and the first conductive semiconductor layer may have Al content higher than Al content of the active layer.

According to an exemplary embodiment, a lighting system may include a substrate, and a light emitting module including a light emitting device provided on the substrate. The light emitting device may include a first conductive semiconductor layer, a second conductive semiconductor layer, and an active layer interposed between the first and second conductive semiconductor layers. The first conductive semiconductor layer, the active layer, and the second conductive semiconductor layer may include Al, the second conductive semiconductor layer may have Al content higher than Al content of the first conductive semiconductor layer, and the first conductive semiconductor layer may have Al content higher than Al content of the active layer.

According to an exemplary embodiment, a method of manufacturing a light emitting device may include forming a first conductive semiconductor layer including Al, forming an active layer including Al on the first conductive semiconductor layer, and forming a second conductive semiconductor layer which may include Al on the active layer. The second conductive semiconductor layer may have Al content higher than Al content of the first conductive semiconductor layer, and the first conductive semiconductor layer may have Al content higher than Al content of the active layer.

DETAILED DESCRIPTION OF THE EMBODIMENTS

Figure 1:
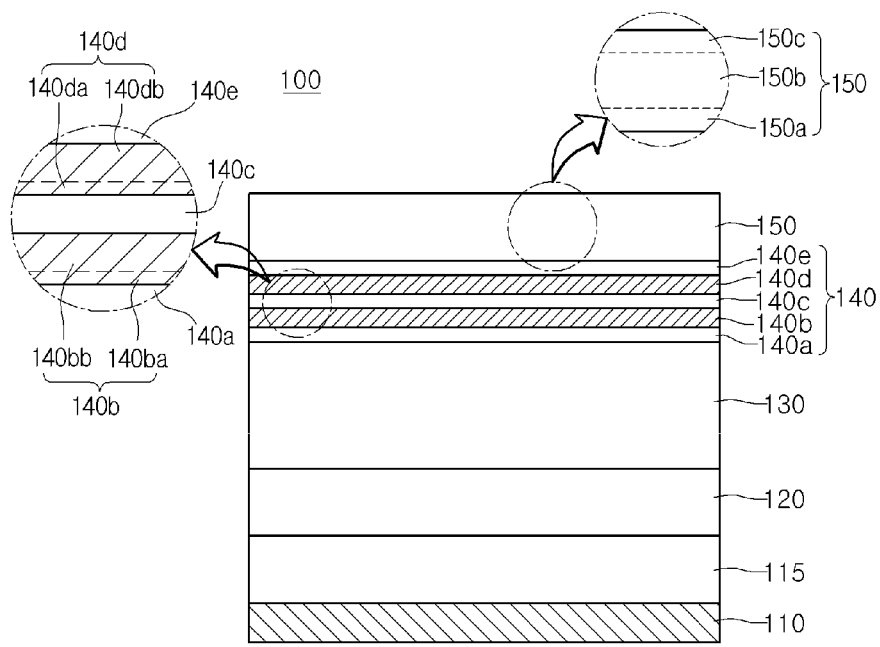
FIG. 1 is a view showing a light emitting device according to an exemplary embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, a light emitting device according to an embodiment and a method of manufacturing the same will be described with reference to accompanying drawings.

FIG. 1 is a view showing a light emitting device 100 according to an exemplary embodiment.

Referring to FIG. 1, the light emitting device 100 may include a substrate 110, a buffer layer 115, an undoped semiconductor layer 120, a first conductive semiconductor layer 130, an active layer 140, and a second conductive semiconductor layer 150.

The buffer layer 115, the undoped semiconductor layer 120, the first conductive semiconductor layer 130, the active layer 140, and the second conductive semiconductor layer 150 may be formed on the substrate 110 through a chemical vapor deposition (CVD) scheme, a molecular beam epitaxy scheme (MBE), a sputtering scheme, or a hybrid vapor phase epitaxy (HVPE) scheme, but the embodiment is not limited thereto.

The substrate 110 may include at least one of sapphire ($Al_2O_3$), SiC, Si, GaAs, GaN, ZnO, Si, GaP, InP, or Ge.

The buffer layer 115 may be formed on the substrate 110. The buffer layer 115 may be formed to reduce a lattice constant difference between the substrate 110 and the first conductive semiconductor layer 130.

The buffer layer 115 may include aluminum (Al). For example, the buffer layer 115 may have a composition formula of $Al_xGa_{1-x}N$ ($0.5 \leq x \leq 1$), in which the x is in the range of about 0.5 to 1, and, preferably, has about 0.8. The buffer layer 115 includes Al having a composition ratio greater than or equal to that of Ga. However, the buffer layer 115 may have various materials.

The buffer layer 115 has a growth temperature in the range of about 1000° C. to about 1200° C. Preferably, the buffer layer 115 may have a growth temperature of about 1100° C. The growth temperature is higher than that of a buffer layer including GaN without Al.

Since Al has a composition ratio higher than that of Ga in the buffer layer 115, and the buffer layer 115 has a high growth temperature in the range of about 1000° C. to about 1200° C., the buffer layer 115 may be grown with superior crystalline. Accordingly, the lattice constant difference between the buffer layer 115 and the substrate 110 can be effectively reduced, and defects or dislocation of the buffer layer 115 can be reduced.

For example, the buffer layer 115 may have a dislocation density in the range of about $10^8$ lots/cm$^2$ to $3 \times 10^8$ lots/cm$^2$. Different from a conventional buffer layer having a dislocation density of about $7 \times 10^9$ lots/cm$^2$, the buffer layer 115 has a lower dislocation density.

The undoped buffer layer 120 may be formed on the buffer layer 115. The undoped semiconductor layer 120 is not doped with N-type or P-type dopants, so that the undoped semiconductor layer 120 may have electrical conductivity significantly lower than that of the first and second conductive semiconductor layers 130 and 150. For example, the undoped semiconductor layer may include a layer having a composition formula of $Al_xGa_{1-x}N$ ($0<x \leq 0.05$), in which the x is in the range of about 0 to 0.05, and, preferably, may be about 0.03. However, the embodiment is not limited thereto, and the undoped semiconductor layer 120 may not include Al.

The undoped semiconductor layer 120 has a growth temperature in the range of about 1050° C. to about 1150° C. Preferably, the undoped semiconductor layer 120 may have a growth temperature of about 1080° C.

The undoped semiconductor layer 120 may have a first thickness to have sufficient crystalline so that the first and second conductive semiconductor layers 130 and 150 and the active layer 140 can be grown without defects and dislocation.

The undoped semiconductor layer 120 includes Al, and is formed on the buffer layer 115 having superior crystalline. Accordingly, the first thickness of the undoped semiconductor layer 120 may be in the range of about 0.5 μm to 1 μm as compared with the undoped semiconductor layer 120 formed on a conventional buffer layer and having a thickness of about 2 μm.

Since the undoped semiconductor layer 120 has the first thickness, the manufacturing cost of the light emitting device 100 can be reduced, and the thickness of the light emitting device 100 can be reduced.

Meanwhile, at least one of the buffer layer 115 or the undoped semiconductor layer 120 may be formed, or none of the buffer layer 115 and the undoped semiconductor layer 120 may be formed.

A light emitting structure is formed on the undoped semiconductor layer 120, and may include the first conductive semiconductor layer 130, the active layer 140, and the second conductive semiconductor layer 150. The light emitting structure may include Al. The second conductive semiconductor layer 150 may have an Al content higher than that of the first conductive semiconductor layer 130, and the first conductive semiconductor layer 130 may have an Al content higher than that of the active layer 140. Hereinafter, the light emitting structure will be described in detail.

The first conductive semiconductor layer 130 may be formed on the undoped semiconductor layer 120. For example, the first conductive semiconductor layer 130 may include an N-type semiconductor layer, and include a material having a composition formula of $Al_xGa_{1-x}N$ ($0.02 \leq x \leq 0.08$). In addition, the first conductive semiconductor layer 130 may be doped with N-type dopants such as Si, Ge, and Sn. The x may have a value in the range of about 0.02 to about 0.08, and, preferably, may have a value of about 0.05. The first conductive semiconductor layer 130 may have various materials.

The growth temperature of the first conductive semiconductor layer 130 may be in the range of about 1000° C. to about 1200° C., and, preferably, may be about 1100° C.

Since the first conductive semiconductor layer 130 may include Al, the first conductive semiconductor layer 130 may have a higher band gap and higher electron mobility as compared with those of a GaN layer without Al.

Accordingly, charges can be effectively spread throughout the whole region of the first conductive semiconductor layer 130, so that superior current spreading can be represented. Accordingly, the light emission efficiency of the light emitting device 100 can be improved.

In addition, since the first conductive semiconductor layer 130 may have a high band gap, the leakage current of the light emitting device 100 can be reduced.

The active layer 140 may be formed on the first conductive semiconductor layer 130. Electrons (or holes) injected through the first conductive semiconductor layer 130 may be recombined with holes (or electrons) injected through the second conductive semiconductor layer 150 at the active layer 140, so that the active layer 140 may emit the light based on the band gap difference of the energy band according to materials of the active layer 140.

The active layer 140 may have a single quantum well structure or a multi-quantum well structure. Although the embodiment is described in that the active layer 140 has a multi-quantum well structure, the embodiment is not limited thereto.

The active layer 140 may include a plurality of barrier layers 140a, 140c, and 140e, and a plurality of quantum well layers 140b and 140d interposed between adjacent well layers among the well layers 140a, 140c, and 140e. The active layer 140 may have various stack structures.

The quantum well layers 140b and 140d may have a composition formula of $Al_xIn_yGa_{1-x-y}N$ ($0 \leq x \leq 0.005$, $0.1 \leq y \leq 0.3$). The growth temperature of the quantum well layers 140b and 140d may be in the range of about 680° C. to about 750° C., and, preferably, may be about 720° C. In the composition formula, the x is in the range of about 0 to about 0.005, and, preferably, may be about 0.001. In addition, the y is in the range of about 0.1 to about 0.3, and, preferably, may be about 0.2.

A composition ratio of Al and indium (In) in the quantum well layers 140b and 140d is adjusted, so that the conglomeration degree of In can be adjusted. In other words, In may be conglomerated by a predetermined amount to contribute to light emission. Accordingly, the composition ratio of Al and In may be adjusted in the quantum well layers 140b and 140d, so that the conglomeration degree of In can be adjusted. Accordingly, an amount of In actually contributing to light emission may be increased, so that the internal quantum efficiency of the light emitting device 100 can be improved.

Each quantum well layer 140b or 140d may have a stack structure of multiple layers. For example, each quantum well layer 140b or 140d may include a first layer 140ba or 140da which may include Al and a second layer 140bb or 140db without Al on the first layer 140ba or 140da.

In other words, the first layers 140ba and 140da may include AlInGaN, and the second layers 140bb and 140db may include InGaN layers. In this case, the first layers 140ba and 140da have a thickness of about 5 Å, and the second layers 140bb and 140db may have a thickness of about 15 Å, but the embodiment is not limited thereto.

The barrier layers 140a, 140c, and 140e may have a composition formula of $Al_xGa_{1-x}N$ ($0.01 \leq x \leq 0.03$). The growth temperature of the barrier layers 140a, 140c, and 140e is in the range of about 820° C. to about 880° C., and, preferably, may be 850° C. In the composition formula, the x is in the range of 0.01 to 0.03, and, preferably, may be 0.02.

The composition ratio of Al in the barrier layers 140a, 140c, and 140e is adjusted to change a band gap, so that the operating voltage can be adjusted. In addition, the low current characteristic of the light emitting device 100 can be improved, so that leakage current can be reduced.

In addition, since the stack structure of the plural quantum well layers 140b and 140d and the plurality of barrier layers 140a, 140c, and 140e may include Al, so that light loss caused by a piezoelectric effect can be reduced.

Meanwhile, a clad layer may be formed on and/or under the active layer 140.

The second conductive semiconductor layer 150 may be formed on the active layer 140. The second conductive semiconductor layer 150 may include a P-type semiconductor, and may include a material having a composition formula of $Al_xGa_{1-x}N$ ($0.1 \leq x \leq 0.3$). In addition, the second conductive semiconductor layer 150 is doped with P-type dopants such as Mg and Ba. In the composition formula, the x has a value in the range of about 0.1 to about 0.3, and, preferably, may have a value of about 0.2. However, the second conductive semiconductor layer 150 may have various materials.

The growth temperature of the second conductive semiconductor layer 150 may be in the range of about 900° C. to 1050° C., and, preferably, may be about 960° C.

Since the second conductive semiconductor layer 150 may include Al, the second conductive semiconductor layer 150 may have superior crystalline.

Meanwhile, the second conductive semiconductor layer 150 may have a stack structure of multiple layers. For example, the second conductive semiconductor layer 150 may include a first layer 150a without Al on the active layer 140, a second layer 150b placed on the first layer 150a and including Al, and a third layer 150c without Al placed on the second layer 150b.

The second layer 150b may include an AlGaN layer, and the first and third layers 150a and 150c may include a GaN layer. In this case, the second layer 150b may have a thickness in the range of about 800 Å to about 1200 Å, and, preferably, may have a thickness of about 1000 Å. The first and third layers 150a and 150c may have a thickness in the range of about 200 Å to about 300 Å, and, preferably, may have a thickness of about 250 Å.

As described above, if the second conductive semiconductor layer 150 includes a plurality of layers, since an AlGaN layer may have superior crystalline, even a GaN layer formed on the AlGaN layer may have superior crystalline. Accordingly, when comparing with a second conductive semiconductor layer including only a GaN layer, the second conductive semiconductor layer 150 may have superior crystalline.

In addition, since the second conductive semiconductor layer 150 may have superior crystalline, doping can be easily performed with respect to the second conductive semiconductor layer 150.

In contrast, the first conductive semiconductor layer 130 may be doped with P-type dopants, and the second conductive semiconductor layer 150 may be doped with N-type dopants. In addition, a third conductive semiconductor layer (not shown) doped with N-type dopants or P-type dopants may be additionally formed on the second conductive semiconductor layer 150. Accordingly, the light emitting structure may have at lest one of N-P, P-N, N-P-N, and P-N-P junction structures, but the embodiment is not limited thereto.

Figure 2:
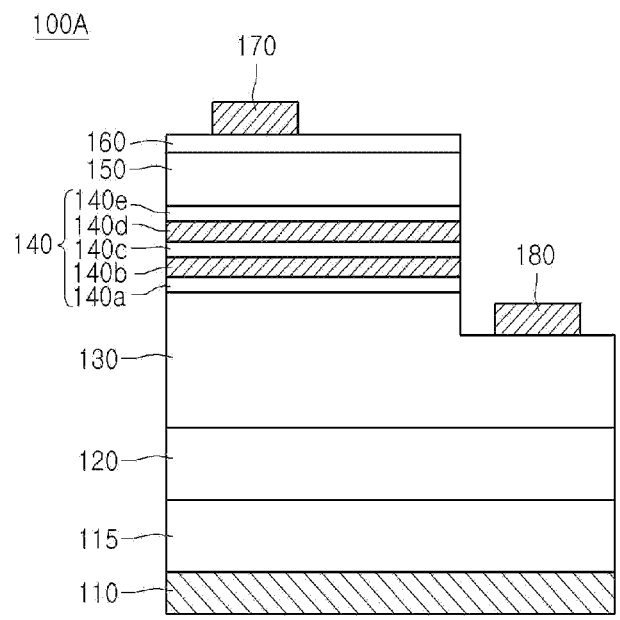
FIG. 2 is a sectional view showing a lateral type light emitting device manufactured based on the light emitting device 100 of FIG. 1.

FIG. 2 is a sectional view showing a lateral type light emitting device 100A manufactured based on the light emitting device 100 of FIG. 1.

Referring to FIGS. 1 and 2, the lateral type light emitting device 100A may be formed by performing Mesa etching with respect to the light emitting device 100 of FIG. 1 to expose a portion of the first conductive semiconductor layer 130. Thereafter, a first electrode 180 may be formed on the first conductive semiconductor layer 130.

A transparent electrode layer 160 may be formed on the second conductive semiconductor layer 150. The transparent electrode layer 160 includes at least one of ITO, IZO(In—ZnO), GZO(Ga—ZnO), AZO(Al—ZnO), AGZO(Al—Ga ZnO), IGZO(In—Ga ZnO), $IrO_x$, $RuO_x$, $RuO_x$/ITO, Ni/$IrO_x$/Au, or Ni/$IrO_x$/Au/ITO, but the embodiment is not limited thereto. The transparent electrode 160 allows the second conductive semiconductor layer 150 to make ohmic contact with the second electrode 170.

A reflective electrode layer may be formed instead of the transparent electrode 160, and the reflective electrode may include at least one of Ag having high reflectance, alloy of Ag, Al, or alloy of Al.

A second electrode 170 may be formed on the transparent electrode layer 160 to supply power to the lateral type light emitting device 100A together with the first electrode 180.

Figure 3:
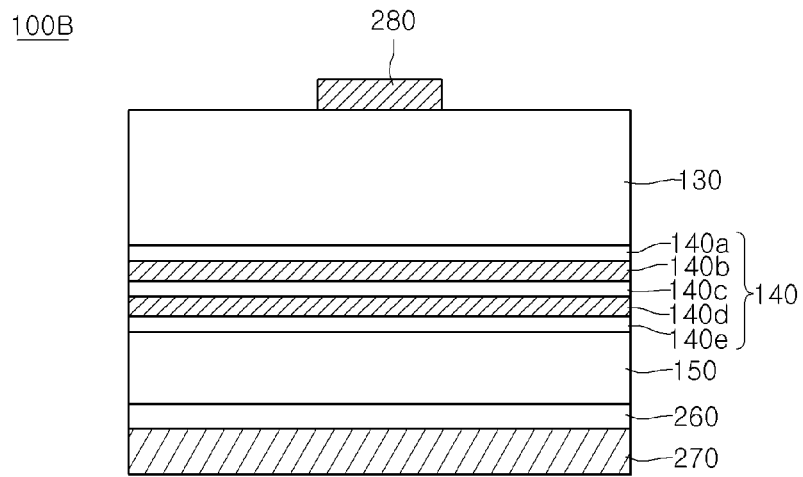
FIG. 3 is a sectional view showing a vertical type light emitting device manufactured based on the light emitting device of FIG. 1.

FIG. 3 is a sectional view showing an exemplary vertical type light emitting device 100B manufactured based on the light emitting device 100.

Referring to FIGS. 1 and 3, the vertical type light emitting device 100B may be formed by forming a reflective layer 260 and a conductive support member 270 under the second conductive semiconductor layer 150 of the light emitting device 100 of FIG. 1, and removing the substrate 110.

The reflective layer 260 may be formed under the second conductive semiconductor layer 150.

The reflective layer 260 may include at least one of Ag, alloy of Ag, Al, alloy of Al, Pt, or alloy of Pt.

The conductive support member 270 may be formed on the reflective layer 260 to supply power to the vertical type light emitting device 100B.

The conductive support member 270 may include at least one of Ti, Cr, Ni, Al, Pt, Au, W, Cu, Mo, or a semiconductor substrate implanted with impurities.

Meanwhile, an adhesion layer (not shown) may be additionally formed between the conductive support member 270 and the reflective layer 160 to improve interfacial adhesive strength between the two layers. In addition, an ohmic layer (not shown) may be additionally formed between the second conductive semiconductor layer 150 and the reflective layer 260 to allow the second conductive semiconductor layer 150 to make ohmic contact with the reflective layer 260.

The substrate 110 may be removed through a laser lift off (LLO) process or an etching process, but the embodiment is not limited thereto.

After the substrate 110 has been removed, portions of the buffer layer 115, the undoped semiconductor layer 120, and the first conductive semiconductor layer 130 may be removed through an etching process such as Inductively Coupled Plasma/Reactive Ion Etching (ICP/RIE) process, but the embodiment is not limited thereto.

After the substrate 110 has been removed, a first electrode 280 may be formed on one of the first conductive semiconductor layer 130, the buffer layer 115, and the undoped semiconductor layer 120 that are exposed. According to an exemplary embodiment, after both of the buffer layer 115 and the undoped semiconductor layer 120 have been removed, a first electrode layer may be formed on the first conductive semiconductor layer 130. The first electrode 280 supplies power to the vertical type light emitting device 100B together with the conductive support member 270.

An exemplary embodiment can provide a light emitting device capable of reducing leakage current.

An exemplary embodiment can provide a light emitting device having a superior current spreading effect.

An exemplary embodiment can provide a light emitting device having superior crystalline.

An exemplary embodiment can provide a light emitting device having improved internal quantum efficiency.

An exemplary embodiment can provide a light emitting device having a reduced a piezoelectric effect.

Figure 4:
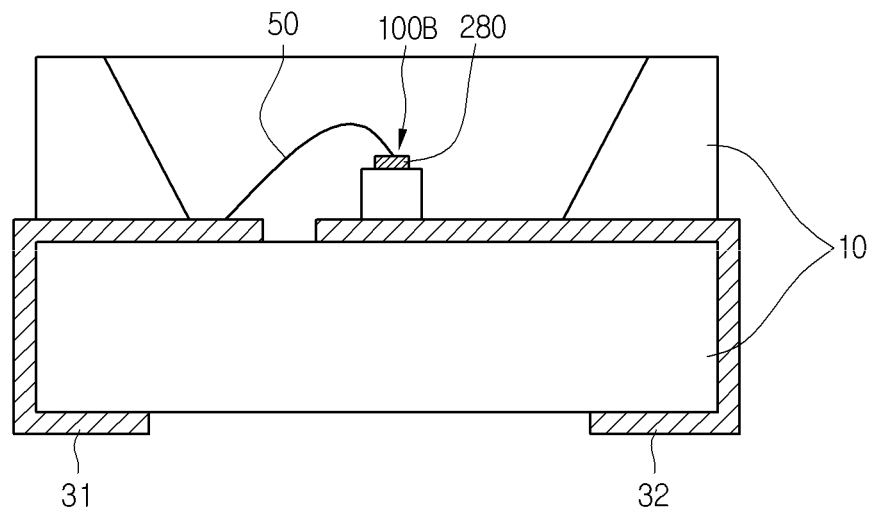
FIG. 4 is a sectional view showing a light emitting device package including a light emitting device according to an exemplary embodiment.

FIG. 4 is a sectional view showing a light emitting device package including the light emitting device according to an exemplary embodiment.

Referring to FIG. 4, the light emitting device package according to the exemplary embodiment includes a body 10, first and second electrode layers 31 and 32 formed on the body 10, the light emitting device 100B provided on the body 10 and electrically connected to the first and second electrode layers 31 and 32 and a molding member 40 that surrounds the light emitting device 100B.

The body 10 may be a conductive substrate including silicon, synthetic resin, or metallic material, and may have a cavity with an inclined lateral surface.

The first and second electrode layers 31 and 32 may be electrically isolated from each other to supply power to the light emitting device 100B. In addition, the first and second electrode layers 31 and 32 may reflect the light emitted from the light emitting device 100B to improve the light efficiency and dissipate heat generated from the light emitting device 100B to the outside.

The light emitting device 100B can be installed on the body 10 or the first or second electrode layer 31 or 32.

The light emitting device 100B may be electrically connected to the first and second electrode layers 31 and 32 through one of a wire scheme, a flip-chip scheme, or a die bonding scheme. According to an exemplary embodiment, in the light emitting device 100B, the first electrode 280 may electrically connected to the first electrode layer 31 through a wire, and directly make contact with the second electrode layer 32 to be connected to the second electrode 32, but the embodiment is not limited thereto.

The molding member 40 may surround the light emitting device 100B to protect the light emitting device 100B. In addition, the molding member 40 may include phosphors to change the wavelength of the light emitted from the light emitting device 100B.

A plurality of light emitting device packages according to an exemplary embodiment are arrayed on a substrate, and a light guide plate, a prism sheet, a diffusion sheet, and a fluorescence sheet, which form an optical member, may be provided on the path of light emitted from the light emitting device package. The light emitting device package, the substrate, and the optical member may constitute a backlight unit or a lighting system. For example, the lighting system may include the backlight unit, the lighting system, an indicator, a lamp, and a street light.

Figure 5:
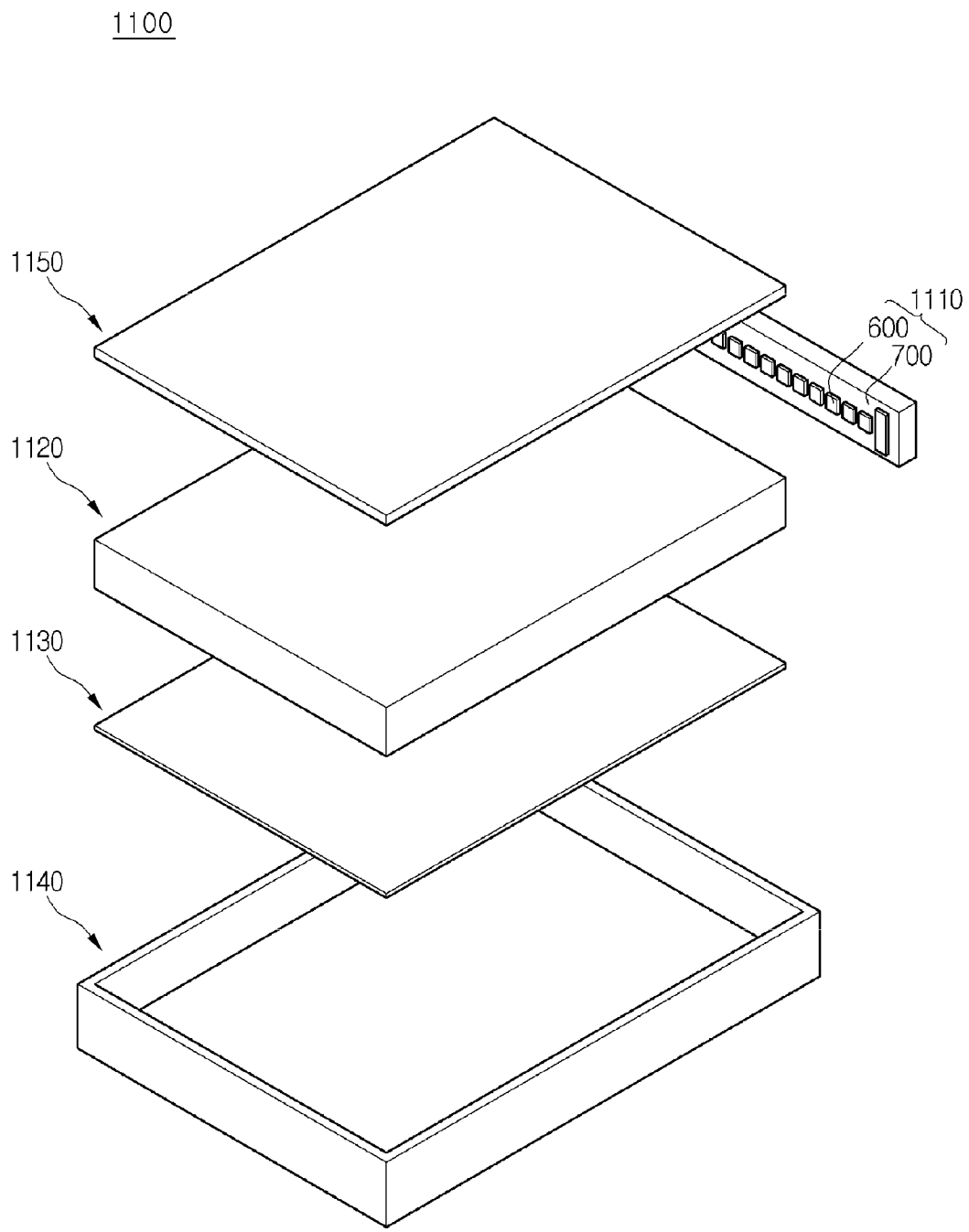
FIG. 5 is a view showing a backlight unit including a light emitting device or a light emitting device package according to an exemplary embodiment.

FIG. 5 is a view showing a backlight unit 1100 including a light emitting device or a light emitting device package according to an exemplary embodiment. The backlight unit 1100 of FIG. 5 is one example of the lighting system, but the embodiment is not limited thereto.

Referring to FIG. 5, the backlight unit 1100 may include a bottom cover 1140, a light guide member 1120 installed in the bottom cover 1140, and a light emitting module 1110 installed at one side or on the bottom surface of the light guide member 1120. In addition, a reflective sheet 1130 is disposed under the light guide member 1120.

The bottom cover 1140 may have a box shape having a top surface being open to receive the light guide member 1120, the light emitting module 1110 and the reflective sheet 1130 therein. In addition, the bottom cover 1140 may include metallic material or resin material, but the embodiment is not limited thereto.

The light emitting module 1110 may include a substrate 700 and a plurality of light emitting device packages 600 installed on the substrate 700. The light emitting device packages 600 may provide the light to the light guide member 1120. According to an exemplary embodiment, although the light emitting module 1110 may include the light emitting device packages 600 provided the substrate 700, a light emitting device according to the embodiment may be directly installed in the light emitting module 1110.

As shown in FIG. 5, the light emitting module 1110 may be installed on at least one inner side of the bottom cover 1140 to provide the light to at least one side of the light guide member 1120.

In addition, the light emitting module 1110 can be provided under the bottom cover 1140 to provide the light toward the bottom surface of the light guide member 1120. Such an arrangement can be variously changed according to the design of the backlight unit 1100 and the embodiment is not limited thereto.

The light guide member 1120 may be installed in the bottom cover 1140. The light guide member 1120 may convert the light emitted from the light emitting module 1110 into the surface light to guide the surface light toward a display panel (not shown).

The light guide member 1120 may include a light guide plate. For instance, the light guide plate can be manufactured by using acryl-based resin, such as polymethyl methacrylate (PMMA), polyethylene terephthalate (PET), polycarbonate (PC), COC or polyethylene naphthalate (PEN) resin.

An optical sheet 1150 may be provided over the light guide member 1120.

The optical sheet 1150 may include at least one of a diffusion sheet, a light collection sheet, a brightness enhancement sheet, or a fluorescent sheet. For instance, the optical sheet 1150 may have a stack structure of the diffusion sheet, the light collection sheet, the brightness enhancement sheet, and the fluorescent sheet. In this case, the diffusion sheet may uniformly diffuse the light emitted from the light emitting module 1110 such that the diffused light can be collected on a display panel (not shown) by the light collection sheet. The light output from the light collection sheet may be randomly polarized and the brightness enhancement sheet may increase the degree of polarization of the light output from the light collection sheet. The light collection sheet may include a horizontal and/or vertical prism sheet. In addition, the brightness enhancement sheet may include a dual brightness enhancement film and the fluorescent sheet may include a transmissive plate or a transmissive film including phosphors.

The reflective sheet 1130 can be disposed under the light guide member 1120. The reflective sheet 1130 may reflect the light, which is emitted through the bottom surface of the light guide member 1120, toward the light exit surface of the light guide member 1120.

The reflective sheet 1130 may include resin material having high reflectivity, such as PET, PC, or PVC resin, but the embodiment is not limited thereto.

Figure 6:
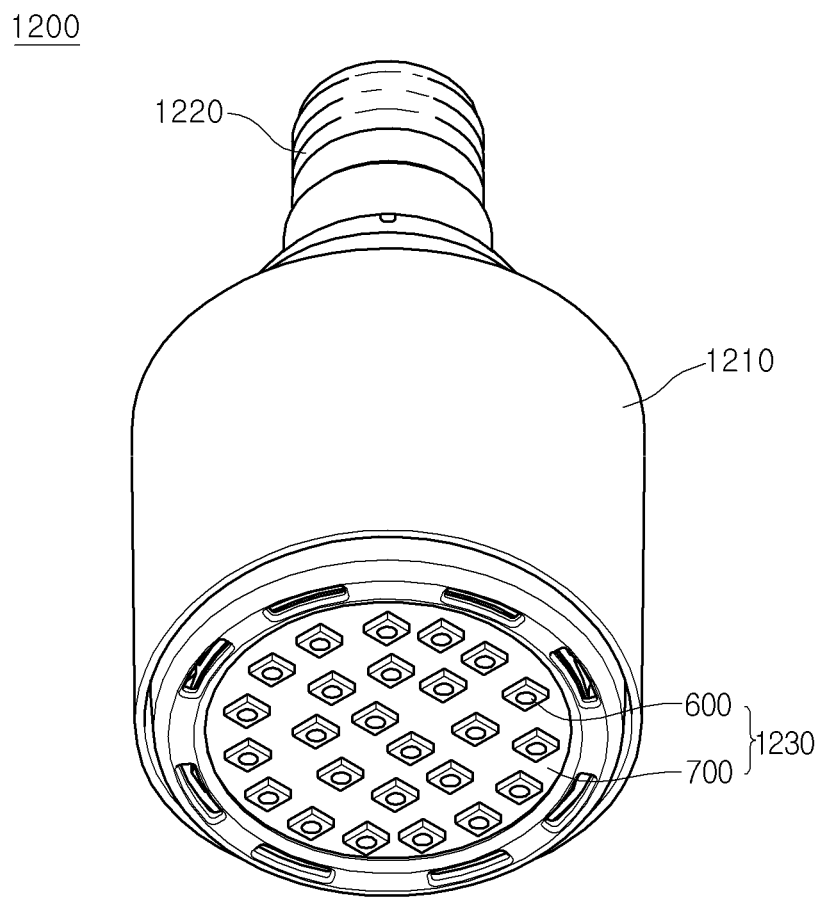
FIG. 6 is a perspective view showing a lighting system including a light emitting device or a light emitting device package according to an exemplary embodiment.

FIG. 6 is a perspective view showing a lighting system 1200 including a light emitting device or a light emitting device package according to the embodiment. The lighting system 1200 shown in FIG. 6 is an example of a lighting system and the embodiment is not limited thereto.

Referring to FIG. 6, the lighting system 1200 may include a case body 1210, a light emitting module 1230 installed in the case body 1210, and a connection terminal 1220 installed in the case body 1210 to receive power from an external power source.

Preferably, the case body 1210 may include material having superior heat dissipation property. For instance, the case body 1210 includes metallic material or resin material.

The light emitting module 1230 may include a substrate 700 and at least one light emitting device package 600 installed on the substrate 700. According to an embodiment, although the light emitting module 1110 may include the light emitting device package 600 installed on the substrate 700, the light emitting device 100B according to the embodiment may be directly installed in the light emitting module 1110.

The substrate 700 may include an insulating member printed with a circuit pattern. For instance, the substrate 700 includes a PCB (printed circuit board), an MC (metal core) PCB, an F (flexible) PCB, or a ceramic PCB.

In addition, the substrate 700 may include material that effectively reflects the light. The surface of the substrate 700 can be coated with a color, such as a white color or a silver color, to effectively reflect the light.

At least one light emitting device package 600 according to the embodiment can be installed on the substrate 700. Each light emitting device package 600 may include at least one LED (light emitting diode). The LED may include a colored LED that emits the light having the color of red, green, blue or white and a UV (ultraviolet) LED that emits UV light.

The LEDs of the light emitting module 1230 can be variously arranged to provide various colors and brightness. For instance, the white LED, the red LED and the green LED can be arranged to achieve the high color rendering index (CRI). In addition, a fluorescent sheet can be provided on the path of the light emitted from the light emitting module 1230 to change the wavelength of the light emitted from the light emitting module 1230. For instance, if the light emitted from the light emitting module 1230 has a wavelength band of blue light, the fluorescent sheet may include yellow phosphors. In this case, the light emitted from the light emitting module 1230 may pass through the fluorescent sheet so that the light is viewed as white light.

The connection terminal 1220 may be electrically connected to the light emitting module 1230 to supply power to the light emitting module 1230. Referring to FIG. 6, the connection terminal 1220 may have a shape of a socket screw-coupled with the external power source, but the embodiment is not limited thereto. For instance, the connection terminal 1220 can be prepared in the form of a pin inserted into the external power source or connected to the external power source through a wire.

According to the lighting system as described above, at least one of the light guide member, the diffusion sheet, the light collection sheet, the brightness enhancement sheet or the fluorescent sheet may be provided on the path of the light emitted from the light emitting module, so that the desired optical effect can be achieved.

As described above, the lighting system may include a light emitting device or a light emitting device package having a reduced operating voltage and improved light efficiency, thereby obtaining superior light efficiency and reliability.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a first conductive semiconductor layer;
   a second conductive semiconductor layer; and
   an active layer interposed between the first and the second conductive semiconductor layers,
   wherein the first conductive semiconductor layer, the active layer, and the second conductive semiconductor layer include Al,
   wherein the second conductive semiconductor layer has Al content higher than Al content of the first conductive semiconductor layer,
   wherein the active layer includes a plurality of quantum well layers and a plurality of barrier layers,
   wherein the quantum well layers have Al content lower than Al content of the barrier layers,
   wherein the second conductive semiconductor layer includes a first layer and a second layer, wherein the second layer of the second conductive semiconductor layer has a thickness of about 800 Å to about 1200 Å, and the first layer of the second conductive semiconductor layer has a thickness of about 200 Å to 300 Å, and
   wherein Al content of the first layer is different from Al content of the second layer.

2. The light emitting device of claim 1, wherein the first conductive semiconductor layer has a composition formula of $Al_xGa_{1-x}N$ ($0.02 \leq x \leq 0.08$).

3. The light emitting device of claim 1, wherein the quantum well layers have a composition formula of $Al_xIn_yGa_{1-x-y}N$ ($0 \leq x \leq 0.005$, $0.1 \leq y \leq 0.3$), and the quantum barrier layers have a composition formula of $Al_xGa_{1-x}N$ ($0.01 \leq x \leq 0.03$).

4. The light emitting device of claim 1, wherein the second conductive semiconductor layer has a composition formula of $Al_xGa_{1-x}N$ ($0.1 \leq x \leq 0.3$).

5. The light emitting device of claim 1, further comprising a buffer layer under the first conductive semiconductor layer, wherein the buffer layer has a composition formula of $Al_xGa_{1-x}N$ ($0.5 \leq x \leq 1$).

6. The light emitting device of claim 5, further comprising an undoped semiconductor layer between the first conductive semiconductor layer and the buffer layer, wherein the undoped semiconductor layer has a composition formula of $Al_xGa_{1-x}N$ ($0 < x \leq 0.05$).

7. The light emitting device of claim 6, wherein the undoped semiconductor layer has a first thickness in a range of about 0.5 μm to about 1 μm.

8. The light emitting device of claim 1, wherein the first layer of the second conductive semiconductor layer without Al is formed on the active layer and the second layer of the second conductive semiconductor layer including Al is formed on the first layer.

9. The light emitting device of claim 1, wherein Al content of the first conductive semiconductor layer and Al content of the active layer are different from each other.

10. The light emitting device of claim 1, further comprising:
    a second electrode on the second conductive semiconductor layer; and
    a first electrode on the first conductive semiconductor layer.

11. The light emitting device of claim 1, further comprising:
    a conductive support member on the second conductive semiconductor layer; and
    an electrode under the first conductive semiconductor layer.

12. The light emitting device of claim 1, wherein the composition ratio of In is adjusted in the quantum well layers so as to adjust the conglomeration degree of In.

13. The light emitting device of claim 1, wherein each of the quantum well layers includes a first layer including Al and a second layer formed on the first layer without Al.

14. The light emitting device of claim 13, wherein the first layer of the quantum well layer includes AlInGaN and the second layer includes InGaN.

15. The light emitting device of claim 13, wherein the first layer of the quantum well layer has a thickness of about 5 Å and the second layer has a thickness of about 15 Å.

16. The light emitting device of claim 1, wherein the second conductive semiconductor layer further includes a third layer, and wherein Al content of the third layer is different from Al content of the second layer.

17. The light emitting device of claim 16, wherein the first layer and the third layer of the second conductive semiconductor layer are formed of GaN and the second layer of the second conductive semiconductor layer is formed of AlGaN.

18. The light emitting device of claim 16, wherein the third layer of the second conductive semiconductor layer without Al is formed on the second layer of the second conductive semiconductor layer.

19. The light emitting device of claim 17, wherein the third layer of the second conductive semiconductor layer has a thickness of about 200 Å to 300 Å.

20. The light emitting device of claim 1, wherein each of the quantum well layers has a plurality of layers and at least one of the plurality of layers includes a layer without Al.

21. A light emitting device package comprising:
    a package body;
    a first and a second electrode layers mounted on the package body;
    a light emitting device provided on the package body and electrically connected to the first and the second electrode layers,
    wherein the light emitting device comprises:
       a first conductive semiconductor layer;
       a second conductive semiconductor layer; and
       an active layer interposed between the first and the second conductive semiconductor layers, wherein the first conductive semiconductor layer, the active layer, and the second conductive semiconductor layer include Al and the second conductive semiconductor layer has Al content higher than Al content of the first conductive semiconductor layer,
       wherein the active layer includes a plurality of quantum well layers and a plurality of barrier layers, and
       wherein the quantum well layers have Al content lower than Al content of the barrier layers,
       wherein the second conductive semiconductor layer includes a first layer and a second layer, wherein the second layer of the second conductive semiconductor layer has a thickness of about 800 Å to about 1200 Å, and the first layer of the second conductive semiconductor layer has a thickness of 200 Å to 300 Å, and
       wherein Al content of the first layer is different from Al content of the second layer.

22. The light emitting device package of claim 21, wherein the first conductive semiconductor layer has a composition formula of $Al_xGa_{1-x}N$ ($0.02 \leq x \leq 0.08$).

23. The light emitting device package of claim 21, wherein Al content of the first conductive semiconductor layer and Al content of the active layer are different from each other.

24. The light emitting device package of claim 21, wherein the quantum well layers have a composition formula of $Al_x$-

$In_yGa_{1-x-y}N$ ($0 \le x \le 0.005$, $0.1 \le y \le 0.3$), and the quantum barrier layers have a composition formula of $Al_xGa_{1-x}N$ ($0.01 \le x \le 0.03$).

25. The light emitting device package of claim 21, wherein the second conductive semiconductor layer has a composition formula of $Al_xGa_{1-x}N$ ($0.1 \le x \le 0.3$).

26. The light emitting device package of claim 21, further comprising a buffer layer under the first conductive semiconductor layer, wherein the buffer layer has a composition formula of $Al_xGa_{1-x}N$ ($0.5 \le x \le 1$).

27. The light emitting device package of claim 21, further comprising an undoped semiconductor layer between the first conductive semiconductor layer and the buffer layer, wherein the undoped semiconductor layer has a composition formula of $Al_xGa_{1-x}N$ ($0 < x \le 0.05$).

28. The light emitting device package of claim 21, wherein the composition ratio of In is adjusted in the quantum well layers so as to adjust the conglomeration degree of In.

29. The light emitting device package of claim 21, wherein each of the quantum well layers includes a first layer including Al and a second layer formed on the first layer without Al.

30. The light emitting device package of claim 29, wherein the first layer of the quantum well layer includes AlInGaN and the second layer includes InGaN.

31. The light emitting device package of claim 29, wherein the first layer of the quantum well layer has a thickness of about 5 Å and the second layer has a thickness of about 15 Å.

32. The light emitting device of claim 21, wherein the first layer of the second conductive semiconductor layer without Al is formed on the active layer and the second layer of the second conductive semiconductor layer including Al is formed on the first layer.

33. The light emitting device package of claim 21, wherein the second conductive semiconductor layer further includes a third layer, and wherein Al content of the third layer is different from Al content of the second layer.

34. The light emitting device package of claim 33, wherein the first layer and the third layer of the second conductive semiconductor layer are formed of GaN and the second layer of the second conductive semiconductor layer is formed of AlGaN.

35. The light emitting device package of claim 33, wherein the third layer of the second conductive semiconductor layer without Al is formed on the second layer of the second conductive semiconductor layer.

36. The light emitting device package of claim 33, wherein the third layer of the second conductive semiconductor layer has a thickness of about 200 Å to 300 Å.

37. The light emitting device package of claim 21, wherein the undoped semiconductor layer has a first thickness in a range of about 0.5 μm to about 1 μm.

38. The light emitting device package of claim 21, wherein the first layer of the second conductive semiconductor layer without Al is formed on the active layer and the second layer of the second conductive semiconductor layer including Al is formed on the first layer.

39. The light emitting device package of claim 21, wherein the light emitting device is an ultraviolet (UV) light emitting device that emits UV light.

40. The light emitting device package of claim 21, wherein a reflective layer includes at least one of Ag, an alloy of Ag, Al, an alloy of AL, Pt, and an alloy of Pt.

41. The light emitting device package of claim 21, wherein each of the quantum well layers has a plurality of layers and at least one of the plurality of layers includes a layer without Al.

42. The light emitting device package of claim 21, further comprising an electrode on the first conductive semiconductor layer.

43. The light emitting device package of claim 21, further comprising a reflective layer under the second conductive semiconductor layer.

44. The light emitting device package of claim 43, further comprising a conductive support member disposed between the reflective layer and the second conductive semiconductor layer.

45. The light emitting device package of claim 44, wherein the conductive support member includes at least one of Ti, Cr, Ni, Al, Pt, Au, W, Cu, Mo, and a semiconductor substrate implanted with impurities.

* * * * *